US009698735B1

(12) United States Patent
McCue et al.

(10) Patent No.: US 9,698,735 B1
(45) Date of Patent: Jul. 4, 2017

(54) LOW VOLTAGE DIFFERENTIAL SIGNAL RECEIVER WITH FULLY INTEGRATED AC COUPLING AND BIAS LATCHING

(71) Applicant: The United States of America as represented by the Secretary of the Air Force, Washington, DC (US)

(72) Inventors: Jamin McCue, Columbus, OH (US); Vipul J. Patel, Dayton, OH (US); Waleed Khalil, Dublin, OH (US); Brian Dupaix, Columbus, OH (US); James Wilson, Washington, DC (US); Steven R Dooley, Beavercreek, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 14/967,766

(22) Filed: Dec. 14, 2015

Related U.S. Application Data

(60) Provisional application No. 62/160,784, filed on May 13, 2015, provisional application No. 62/161,993, filed on May 15, 2015.

(51) Int. Cl.
*H03K 3/00* (2006.01)
*H03F 1/30* (2006.01)
(Continued)

(52) U.S. Cl.
CPC ......... *H03F 1/301* (2013.01); *H03F 3/45179* (2013.01); *H04B 1/16* (2013.01);
(Continued)

(58) Field of Classification Search
CPC . H03F 2203/45112; H03F 2203/45116; H03F 2203/45156; H03F 1/301; H03F 3/45179; H04B 1/16
(Continued)

(56) References Cited

U.S. PATENT DOCUMENTS 7,620,121 B1 * 11/2009 Tetzlaff ............... H04L 25/0296
327/303
7,746,121 B2 * 6/2010 Khoury ............ H03K 19/01707
327/108

(Continued)

OTHER PUBLICATIONS

Hopkins, Capacitive Coupled Communication (CH 3) in Coupled Data Communications Techniques for High-Performance and Low-Power Computing, New York, Springer, 2010, ch. 3, pp. 51-77.

(Continued)

*Primary Examiner* — Ryan Jager
(74) *Attorney, Agent, or Firm* — AFMCLO/JAZ; Jason Sopko

(57) ABSTRACT

A Low Voltage Differential Signaling (LVDS) compliant receiver includes a differential amplifier having inputs and outputs. A first input coupling capacitor and second input coupling capacitor are electrically coupled to each of the first differential input and the second differential input, respectively. The receiver also includes a first and a second regenerative feedback latching mechanism, and the first regenerative feedback latching mechanism is electrically coupled between the first input coupling capacitor and the first differential output. The second regenerative feedback latching mechanism is electrically coupled between the second input coupling capacitor and the second differential output. An integrated circuit substrate includes each of the differential amplifier, the first differential input, the second differential input, the first differential output, the second differential output, the first regenerative feedback latching apparatus, and the second regenerative feedback latching apparatus are contained thereon. The first and the second input coupling capacitor are on-chip.

1 Claim, 5 Drawing Sheets

(51) Int. Cl.
　　　*H03F 3/45*　　　(2006.01)
　　　*H04B 1/16*　　　(2006.01)

(52) U.S. Cl.
　　　CPC ............... *H03F 2203/45112* (2013.01); *H03F 2203/45116* (2013.01); *H03F 2203/45156* (2013.01)

(58) Field of Classification Search
　　　USPC ........................................................ 327/108
　　　See application file for complete search history.

(56) References Cited

U.S. PATENT DOCUMENTS

| | | | | |
|---|---|---|---|---|
| 8,638,838 | B1* | 1/2014 | Betts | H04L 5/16 |
| | | | | 326/30 |
| 9,118,305 | B2* | 8/2015 | Jeffries | H04L 7/0008 |
| | | | | 327/307 |
| 2008/0180278 | A1* | 7/2008 | Denison | A61N 1/3702 |
| | | | | 340/870.18 |
| 2012/0194001 | A1* | 8/2012 | Zhou | H04L 25/0272 |
| | | | | 307/106 |
| 2013/0293292 | A1* | 11/2013 | Droege | H01L 25/0657 |
| | | | | 327/565 |

OTHER PUBLICATIONS

Lei Lou, 3 gb/s AC coupled chip-to-chip communication using a low swing pulse receiver, Solid-State Circuits, IEEE Journal of, vol. 41, No. 1, pp. 287,296, Jan. 2006.

Quan, High Speed Transceivers & Building Blocks, International Solid-State Circuits Conference, Session 20.2, Feb. 2011.

Drost, Proximity Communication, Solid-State Circuits, IEEE Journal of, vol. 39, No. 9, pp. 1529-1535, Sep. 2004.

\* cited by examiner

LOW VOLTAGE DIFFERENTIAL SIGNAL RECEIVER WITH FULLY INTEGRATED AC COUPLING AND BIAS LATCHING

Pursuant to 37 C.F.R. §1.78(a)(4), this application claims the benefit of and priority to prior filed Provisional Application Ser. No. 62/160,784, filed May 13, 2015, and Provisional Application Ser. No. 62/161,993, filed May 15, 2015 which are expressly incorporated herein by reference.

RIGHTS OF THE GOVERNMENT

The invention described herein may be manufactured and used by or for the Government of the United States for all governmental purposes without the payment of any royalty.

FIELD OF THE INVENTION

The present invention relates generally to wired electronic communication interfaces and, more particularly, to differential signaling as an analog transmission modality for high speed digital data.

BACKGROUND OF THE INVENTION

Due to the technological growth and user demand, data transfers are increasing dramatically in all areas of communications. For example, data streams for digital video, HDTV, and color graphics are requiring higher and higher bandwidth. The sheer volume of available high-quality high-resolution content is one driving force for high-speed interconnects between chips, functional boards, and systems.

These advances have been driven by integrated circuit scaling which has significantly increased the sample rates attainable by processors, data converters, and digital transceivers over the last decade. The desire for both high speed and high resolution in these systems can require chip-to-chip data rates in excess of 100 Gb/s. To support this input bandwidth, compact on-chip receivers are needed which minimize area and power without adding undue complexity to the design. However, current paradigms in chip-to-chip communications tend to push designers to one of two extremes: multiplexing dozens of low-speed data lines to aggregate the desired throughput or serializing the data using synchronized SERDES (SERializer/DESerializer) channels operating at tens of Gb/s.

Though effective, both of these techniques display distinct disadvantages when feeding high-speed mixed-signal blocks. In the first case, implementing dozens of low-speed lines consumes large amounts of chip and PCB real estate in the form of I/O pads, multiplexing circuitry, and board traces. High-speed SERDES systems overcome these issues by reducing I/O pins and board routing by serializing the input data. The implementation of such systems, however, is considerably more complex than the low-speed parallel option. High-speed SERDES receivers must equalize incoming data to account for channel loss, decipher the encoding used to maintain DC balance, and parallelize the result for use on-chip. These steps add significant overhead to any design and increase system complexity dramatically. Ideally, efficient high speed data throughput may be achieved at speeds between these two extremes, reducing the total number of channels as compared with a more parallel approach while avoiding the high channel rates which require equalization, encoding, and other overhead.

From a design perspective, the data of interest may be digital, but often analog topologies are selected to drive these high-speed transmission lines. As an example, the Low Voltage Differential Signaling (LVDS) protocol (IEEE Std 1596.3-1996) is a physical layer standard for digital wireline communications (by way of example, see FIG. 1). This protocol implements a high speed, low power differential architecture to minimize electronic noise and ensure high fidelity data reception. To maintain a performance baseline, the LVDS protocol sets many characteristics of the communications interface including a 1.125 V to 1.275 V output common mode, a 250 mV to 400 mV output data swing, a 100 mV receiver sensitivity, and a 25 mV receiver hysteresis. Additionally, an input common mode voltage range of 0.1 V to 2.3 V is required of the receiver to account for differences in ground potentials between the transmitter and receiver.

Low-voltage differential signaling is a generic interface standard for high-speed data transmission, utilizing high frequency analog circuit techniques to provide multi-gigabit data transfers over wireline interconnects. While the IEEE 1596.3-1996 standard specifies the physical layer as an electronic interface, this standard defines driver and receiver electrical characteristics only. It does not define protocol, interconnect, or connector details as these aspects are application specific.

The LVDS differential driver produces odd-mode transmission: equal and opposite currents flowing in the transmission lines. The current returns within the wire pair, so the current loop area is small, and therefore generates the lowest amount of electro-magnetic interference (EMI). The current source limits any spike current that could occur during transitions. Since there are no spike currents, multi gigabit data rates are possible without a substantial increase in power dissipation. In addition, the constant current driver output can tolerate transmission lines shorted together, or to ground, without creating thermal problems.

The differential receiver is a matched device that detects low amplitude differential signals and then amplifies them into standard logic levels. The signal has a typical driver offset of 1.2 V while the receiver accepts an input range of 0.1 V to 2.3 V. This input range eliminates the issues associated with differing ground potentials and allows for the rejection of common mode noise picked up along the interconnect of up to ±1 V.

In addition, hot swapping of LVDS drivers and receivers is possible because the constant current drive eliminates damage potential. The LVDS interconnect also enables failsafe functionality, which prevents output oscillations when the input pins are floating. For these reason (high speed, low power, noise control, and cost advantages) LVDS is a popular choice in short-range, point-to-point systems for telecommunications, data communications, displays, and application specific data transfer.

However, the LVDS wide input range proves increasingly difficult to accommodate as transistor sizes scale and supply voltages drop below 1.5 V. Current wireline communication systems achieve the necessary input common mode range by resorting to slow, thick-gate transistors capable of handling the large voltage range or by altogether removing the DC variation with AC coupling capacitors. Typical implementation of both these methods provides sub-optimal results by sacrificing speed and size to meet the LVDS specification for input voltage range. For thick-gate transistor implementations, the increased layout size and associated parasitics reduce the maximum speed of the receiver. Alternately, AC coupled implementations typically make use of large, board mounted capacitors for coupling. This methodology consumes vast board area and requires data encoding to maintain DC balance.

As a result, there exists a need in the art for an LVDS type interconnect having on-chip form factor capacitors for AC coupling while enabling reliable transmission of unencoded data during periods of sustained logic output and having tolerance to process, voltage, and temperature (PVT) variations.

SUMMARY OF THE INVENTION

The present invention overcomes the foregoing problems and other shortcomings, drawbacks, and challenges of enabling LVDS type infrastructures having low supply voltages and small capacitor AC coupling. While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention A Low Voltage Differential Signaling (LVDS) compliant receiver is provided. The receiver includes a differential amplifier having a first differential input and a second differential input, and a first differential output and a second differential output. A first input coupling capacitor and second input coupling capacitor are electrically coupled to each of the first differential input and the second differential input, respectively. The receiver also includes a first regenerative feedback mechanism and a second regenerative feedback latching mechanism, and the first regenerative feedback latching mechanism is electrically coupled between the first input coupling capacitor and the first differential output. The second regenerative feedback latching mechanism is electrically coupled between the second input coupling capacitor and the second differential output. An integrated circuit substrate includes each of the differential amplifier, the first differential input, the second differential input, the first differential output, the second differential output, the first regenerative feedback latching apparatus, and the second regenerative feedback latching apparatus are contained thereon The first input coupling capacitor and the second input coupling capacitor are on-chip.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above and the detailed description of the embodiments given below, serve to explain the principles of the present invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

In embodiments of the disclosed invention described below, LVDS or other common mode requirements are satisfied by AC coupling the data. However, instead of a large form factor board-mounted capacitor, a small, fully integrated coupling capacitor is used to limit the area consumed by the receiver. Additionally, the receiver utilizes a data feedback structure to alter the receiver bias based on the incoming data, thus latching the data. This bias latching structure coupled with the small input capacitor removes the effects of DC imbalance and baseline wander (for example, data dependent jitter and undefined logic states) without necessitating DC balancing or encoding of the data. In this way, the effective receiver data rate is increased by the removal of the encoding overhead. Overall, the disclosed topology is both small, improving area efficiency, and simple, creating a robust solution for highly integrated wireline systems.

Figure 1:
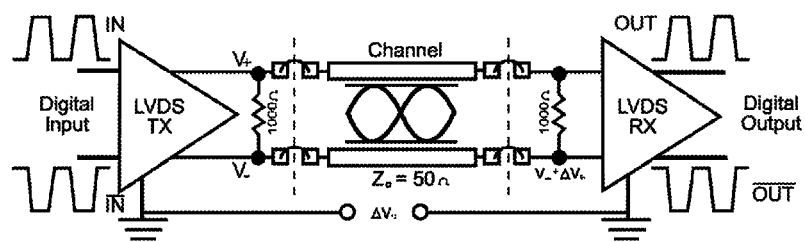
FIG. 1 illustrates an LVDS serial link showing the digital input and output, line matching, and receiver input voltage as a function of differing ground potential, $\Delta V_G$.

To enable the short range chip-to-chip communications necessary for high speed mixed-signal functionality, a receiver should be compatible with current physical layer standards to ensure interoperability with available high-speed data sources. Furthermore, the receiver should be simple, compact, and fully integrated to minimize chip area and reduce unnecessary circuit complexity. To satisfy the interoperability requirement, embodiments of the disclosed receiver may use the widely adopted LVDS paradigm, depicted and described earlier in FIG. 1. To minimize area and complexity, the design utilizes small, fully integrated AC coupling along with a single stage amplifier and 1-bit feedback to fully implement the receiver functionality.

Prior art LVDS receivers are based on the positive feedback design that delivers the needed sensitivity and hysteresis required by the standard. However, this basic topology does not cover the entire LVDS common mode range. For this, architectures have relied on common mode level shifters, or most commonly, rail-to-rail input stages making use of folded cascode structures. As transistor sizes scale and supply voltages drop below 1.5 V, accommodating the >2 V common mode range becomes difficult. Additional prior art designs utilizing thick gate transistors mitigate this problem, but the introduction of these devices into the signal path increases capacitive loading and limits the maximum data rate of the receiver. Instead of seeking to accommodate the prescribed common mode range, the disclosed receiver AC couples the LVDS data. Not only does this remove the DC common mode of the data stream, but it also allows the receiver to achieve robust operation through isolated on-chip biasing.

Figure 2:
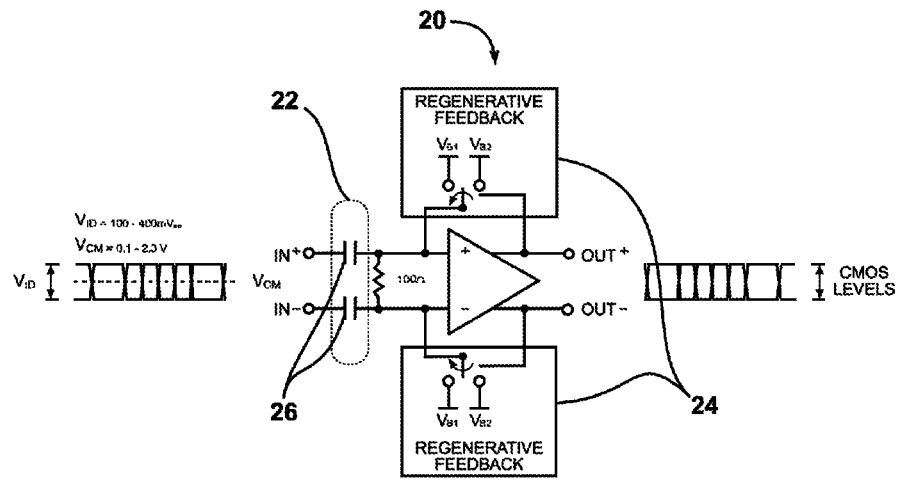
FIG. 2 is a top level schematic representation of an embodiment of the disclosed invention.

Embodiments of the LVDS compatible receiver ("receiver") 20 as disclosed herein incorporate both integrated AC coupling 22 and bias latching 24 into the receiver 20 as depicted in FIG. 2. The disclosed invention enables the receiver 20 to AC couple incoming data with a fully integrated architecture while removing the need for encoding or DC balancing. As used herein, the term "on-chip," as applied to capacitors, shall be used to differentiate from off-chip discrete capacitors. For example, on-chip contemplates both capacitors disposed on the same semiconductor substrate as other integrated circuit components, as well as capacitors disposed between layers of a multi-layer semiconductor device. With respect to the various suitable configurations of capacitors as disclosed herein, several varieties of capacitor construction may yield acceptable results to achieve design objectives. For example, Metal Insulator Metal (MIM), Vertical (natural) having a plurality of co-planer interdigitated fingers, or air gap designs may be employed in embodiments of the disclosed invention.

In embodiments of the disclosed invention, the input coupling capacitors 26 are sized minimally so that they can be integrated on-chip in an area efficient manner. Such minimal sizing of the selected capacitors should meet the minimum signal requirements of the receiver. Further, capacitor 26 sizing may also be selected so that the input pulse from each bit decays within the allotted bit time (or within one bit period). By ensuring each bit is coupled into the receiver 20 and decays before a subsequent bit is received, data dependent jitter in the receiver 20 may be limited and baseline wander is effectively removed.

Figure 3:
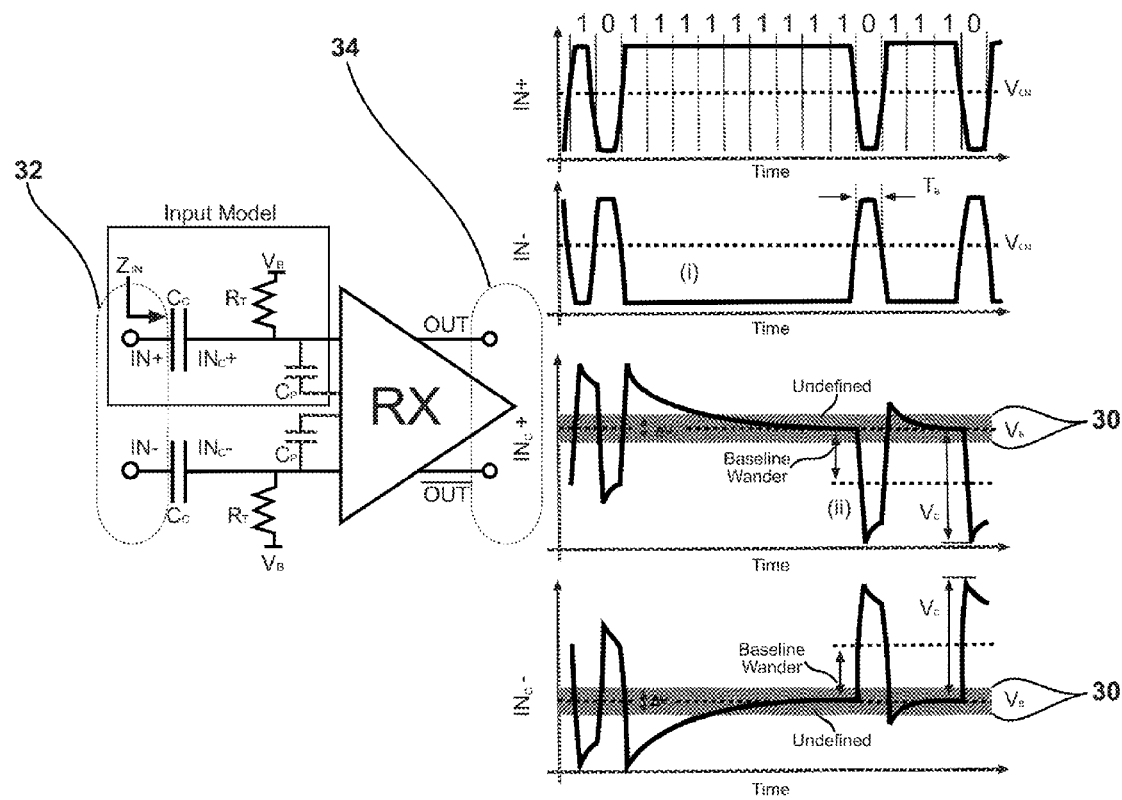
FIG. 3 demonstrates the effects of DC imbalance and long strings of invariant data on an AC coupled receiver. As the positive and negative inputs of the coupled waveform converge to $V_B$, the receiver enters an undefined state and baseline wander occurs with the next bit transition.
Figure 4:
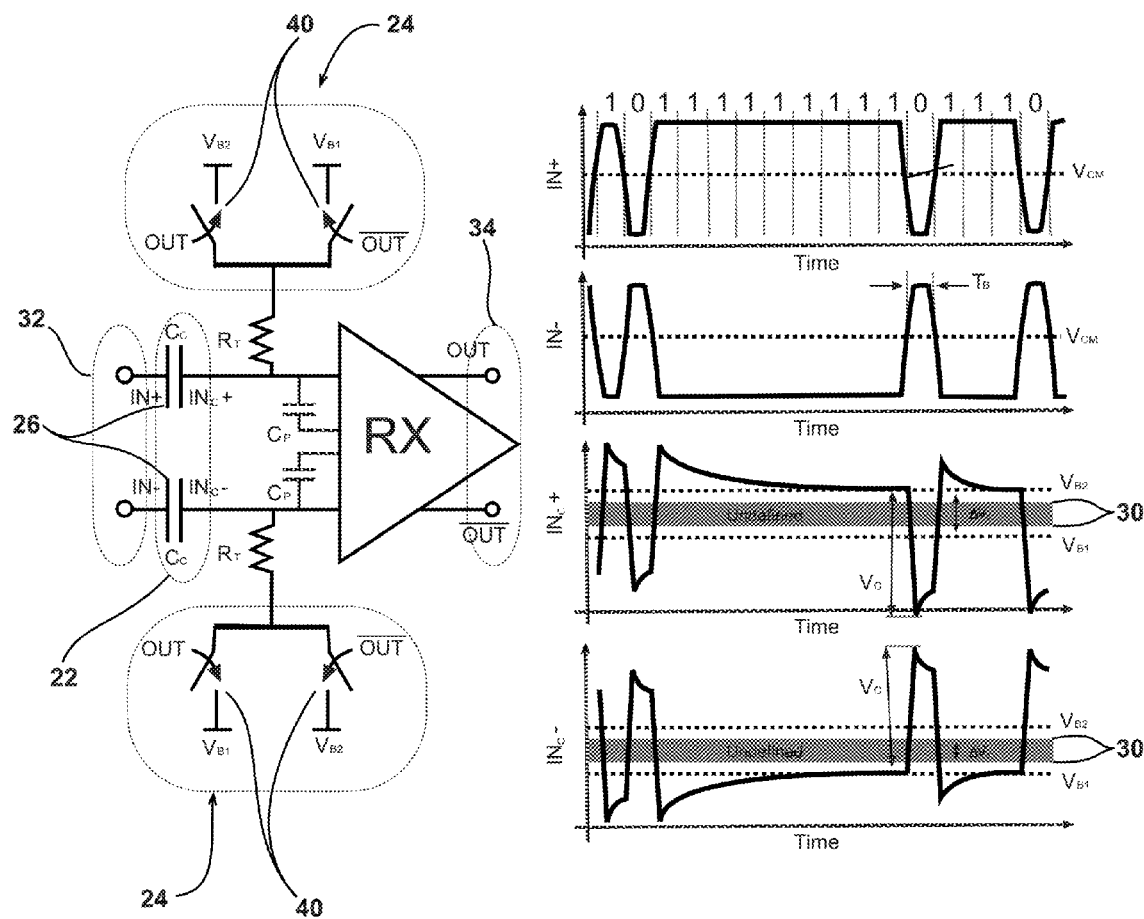
FIG. 4 demonstrates that by switching between two bias voltages ($V_{B1}$ and $V_{B2}$), the receiver latches the incoming data. This precludes the receiver from entering an undefined logic state but does not eliminate baseline wander.

As see in FIG. 3, it should be noted that in the absence of bias latching 24, long trains of 1's or 0's cause the AC coupled input 32 to quickly decay into the receiver dead-zone (or undefined zone) 30, as a result of the relatively small coupling capacitance. This creates an undefined logic state at the output 34 that may be detrimental to the receiver's function. To ameliorate this concern, bias latching 24 may be implemented through the switching of the receiver common mode bias, as shown in FIG. 4. The incoming data stream is fed back to bias switches 40 that independently adjust the bias voltage of the two differential legs of the receiver. The positive and negative inputs 32 (the positive and negative inputs 32 and positive and negative outputs 34 may be referred to as a pair of inputs and a pair of outputs, respectively) of the receiver 20 then decay to separate known voltages, maintaining the logic state of the receiver 20 until an incoming data transition toggles the bias. Because of this, embodiments of the disclosed invention eliminate the need for DC balanced data in the AC coupled system.

Figure 5:
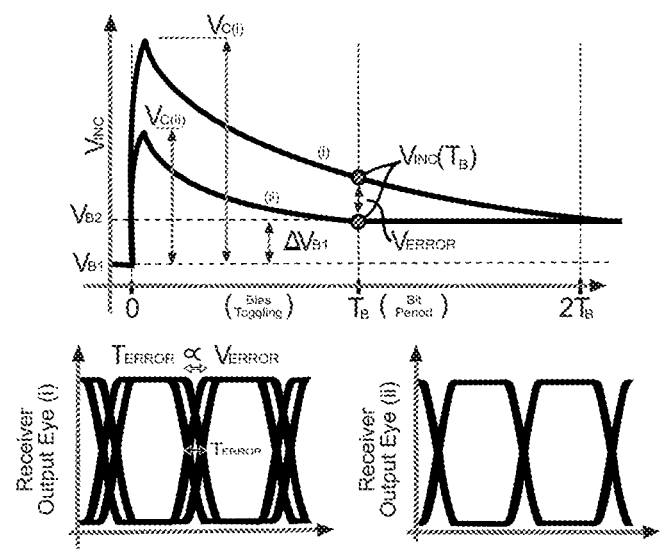
FIG. 5 illustrates the negative effect that a large Cc has on jitter. When the input does not settle to its bias before the bit period (TB), a data dependent baseline offset ($V_{ERROR}$) results. This error introduces data dependent jitter of magnitude ($T_{ERROR}$) proportional to the offset.

One drawback of AC coupling the LVDS channel is the baseline wander that occurs with an unbalanced signal. Given the arbitrary nature of mixed signal data, coding (such as 8b/10b encoding) or data scrambling could be used to ensure DC balance, removing low frequency data content that would otherwise be attenuated by the coupling capacitor. Despite its advantages, the use of coding lowers the effective data rate of the channel as well as increasing the power, area, and latency of the receiver. Instead, in the disclosed invention the integrated AC coupling 22 of the receiver 20 may be designed such that each bit fully decays before a subsequent bit is received, thus eliminating baseline wander and the associated data dependent jitter as illustrated in FIG. 5. It should be noted that both the AC coupling 22 and bias latching 24 functions may be implemented on-chip to minimize area, removing board mounted input coupling capacitors 26 and facilitating short range or 3D stacked chip-to-chip communications. For the purposes of this discussion, "on-chip" may be understood to mean contained on the same integrated circuit substrate. Further, while it is understood that integrated circuits may be fabricated from a plurality of layers, "the same integrated circuit" shall be understood to mean directly or indirectly in contact with the base layer substrate of a given integrated circuit.

Figure 6:
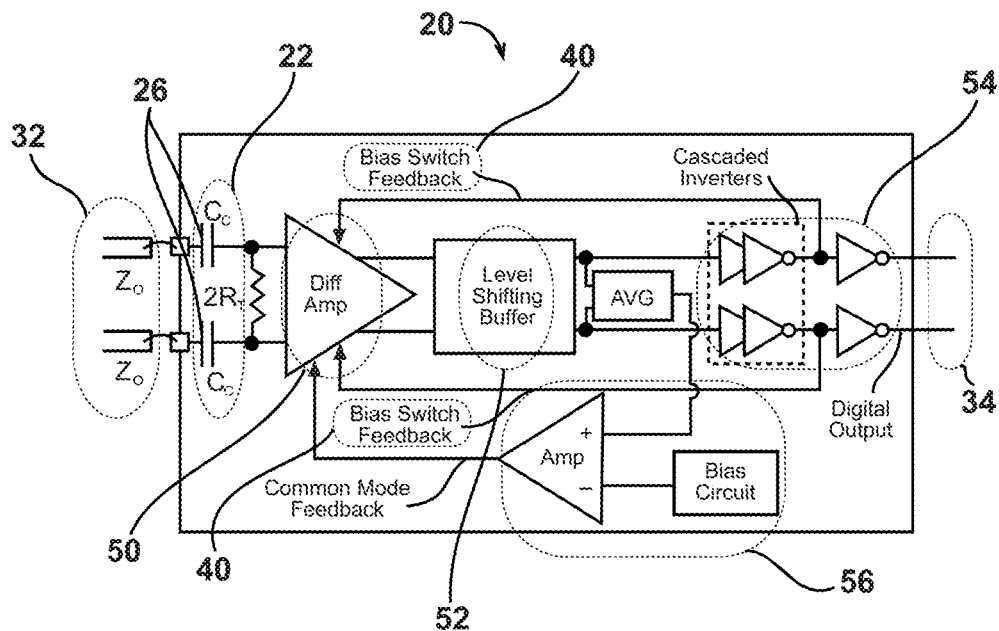
FIG. 6 is a block diagram of an embodiment of the disclosed invention.

A block diagram of one embodiment of the disclosed LVDS receiver 20 is shown in FIG. 6. The receiver is realized with a single stage differential amplifier 50, a level shifting buffer 52, and inverters 54 which produce full-scale digital outputs 34 from the low voltage differential input 32. Because the bias switches 40 are implemented within the amplifier 50, analog feedback 56 may be used to ensure operation across a wide range of PVT. This is in contrast to other realizations which rely on inverters for both the input amplifier and the bias, precluding analog adjustment for robust operation.

Figure 7:
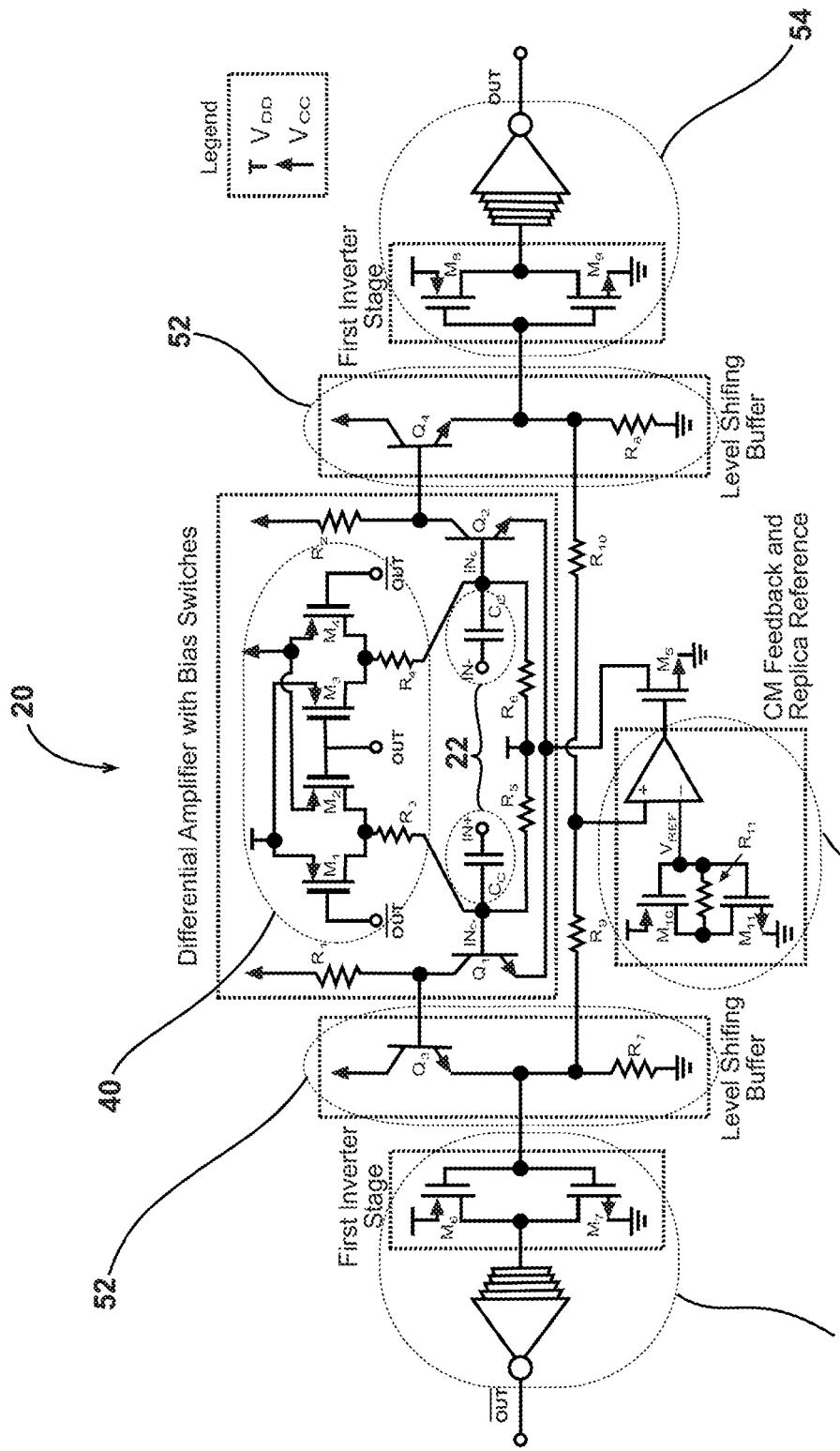
FIG. 7 is a schematic representation of an embodiment of the disclosed receiver.

Turning attention to FIG. 7. The receiver 20 embodiment is realized in a fully integrated architecture. After integrated AC coupling 22, four transistors form the bias switches 40. This is followed by level shifting 52 and full-scale digital output 34. To ensure a constant duty cycle in the data output, common mode feedback is employed within the LVDS receiver embodiment for robust PVT operation and to enable functionality with changing supply voltage.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A Low Voltage Differential Signaling (LVDS) compliant receiver, the receiver comprising:
   a differential amplifier having a first differential input and a second differential input, and a first differential output and a second differential output;
   a first input coupling capacitor and second input coupling capacitor electrically coupled to each of the first differential input and the second differential input, respectively;
   a first regenerative feedback latching mechanism and a second regenerative feedback latching mechanism, wherein the first regenerative feedback latching mechanism is electrically coupled between the first input coupling capacitor and the first differential output, and wherein the second regenerative feedback latching mechanism is electrically coupled between the second input coupling capacitor and the second differential output;

an integrated circuit substrate wherein each of the differential amplifier, the first differential input, the second differential input, the first differential output, the second differential output, the first regenerative feedback latching mechanism, and the second regenerative feedback latching mechanism are contained thereon;

wherein the first input coupling capacitor and the second input coupling capacitor are on-chip;

further including a sensing or averaging circuit coupled to the first differential output and the second differential output;

further including a second differential amplifier having inputs coupled to the sensing or average circuit and connected to a reference circuit configured to generate a known reference signal; and wherein an output of the amplifier is used as analog feedback configured to provide robustness against variations in process, temperature, and voltage.

* * * * *